United States Patent
Dosho et al.

(10) Patent No.: US 7,327,182 B2
(45) Date of Patent: Feb. 5, 2008

(54) SWITCHED CAPACITOR FILTER AND FEEDBACK SYSTEM

(75) Inventors: Shiro Dosho, Osaka (JP); Yusuke Tokunaga, Hyogo (JP); Takashi Morie, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/396,464

(22) Filed: Apr. 4, 2006

(65) Prior Publication Data

US 2006/0226896 A1    Oct. 12, 2006

(30) Foreign Application Priority Data

Apr. 6, 2005    (JP)    ............................... 2005-110272

(51) Int. Cl.
G06F 7/64    (2006.01)
(52) U.S. Cl. ...................................... 327/337; 327/554
(58) Field of Classification Search ................ 327/337, 327/551–554; 331/17; 341/150
See application file for complete search history.

(56) References Cited

U.S. PATENT DOCUMENTS

| | | |
|---|---|---|
| 6,420,917 B1 | 7/2002 | Klemmer |
| 7,078,946 B2 * | 7/2006 | van der Valk et al. ...... 327/156 |
| 2004/0008133 A1 * | 1/2004 | Manganaro .................. 341/150 |
| 2004/0263261 A1 * | 12/2004 | Dosho et al. .................. 331/17 |
| 2006/0119444 A1 * | 6/2006 | Horan ........................... 331/17 |
| 2007/0096795 A1 * | 5/2007 | Georgescu et al. ......... 327/536 |
| 2007/0205825 A1 * | 9/2007 | Dosho et al. ................ 327/554 |

OTHER PUBLICATIONS

Tai-Cheng Lee, "A Stabilization Technique for Phase-Locked Frequency Synthesizers," Symposium on VLSI Circuits Digest of Technical Papers, 2001, pp. 39-42.

* cited by examiner

Primary Examiner—Tuan T. Lam
Assistant Examiner—Diana J Cheng
(74) Attorney, Agent, or Firm—McDermott Will & Emery LLP (57) ABSTRACT

A switched capacitor filter comprises three switched capacitor circuits. Each switched capacitor circuit has a capacitance. A first state that the capacitance is connected to an input end of a current signal, a second state that the capacitance is connected to an output end of a voltage signal, and a third state that the capacitance is connected to a side of a filter capacitance, are cycled. These three switched capacitor circuits are operated under an interleave control so that the first to third states do not each overlap between the three switched capacitor circuits.

3 Claims, 13 Drawing Sheets

SWITCHED CAPACITOR FILTER AND FEEDBACK SYSTEM

CROSS REFERENCE TO RELATED APPLICATIONS

This Non-provisional application claims priority under 35 U.S.C. §119(a) on Patent Application No. 2005-110272 filed in Japan on Apr. 6, 2005, the entire contents of which are hereby incorporated by reference.

BACKGROUND OF THE INVENTION

1. Field of the Invention

The present invention relates to a switched capacitor filter. More particularly, the present invention relates to a technology of a switched capacitor filter preferable as a loop filter in a feedback system, such as a phase locked loop circuit, a delay lock loop circuit, or the like.

2. Description of the Related Art

Today, more and more functions are being incorporated into a system LSI (large scale integrated), so that the circuit scale of the system LSI tends to increase. Therefore, there is a universal demand for a reduction in each circuit incorporated in a system LSI.

The system LSI is substantially inevitably provided with a phase locked loop circuit (hereinafter also referred to as a "PLL"). The PLL has a constraint that the maximum value of a response time cannot be larger than about one tenth of the frequency of an input clock. Therefore, it is necessary to set the CR (capacitive-resistance) product of a loop filter which is included in the PLL to be relatively large. To achieve a relatively large CR product, the capacitance value of a capacitance included in the loop filter is generally set to be large. Therefore, the loop filter occupies a most portion of the circuit area of the PLL, compared to the other components of the PLL. In the PLL, the lower the frequency of the input clock, the longer the response time. Therefore, the capacitance value of the capacitance included in the loop filter needs to be set to be still larger. As a result, the circuit scale of the PLL further increases. To solve such a problem, the reduction of the loop filter circuit scale is also required.

Use of a switched capacitor filter is considerably effective for the reduction of the loop filter circuit scale. In the switched capacitor filter, a resistance which is a component of the filter is implemented as a switched capacitor, and a considerably large resistance can be obtained using a relatively small switched capacitor. Also, by reducing the amount of an input current, the total capacitance of the switched capacitor filter can be reduced, thereby reducing the circuit scale and power consumption.

However, conventional switched capacitor filters are constructed so that the switched capacitor outputs a voltage which occurs while it samples an input current. Therefore, when the switched capacitor is connected in the input side, i.e., a current is input, a voltage which gradually increases (gradually decreases when the current is negative) is output. When the switched capacitor is disconnected from the input side, i.e., a current is not input, a smoothed constant voltage is output. In other words, conventional switched capacitor filters output a voltage signal without completely smoothing an input signal.

Figure 12:
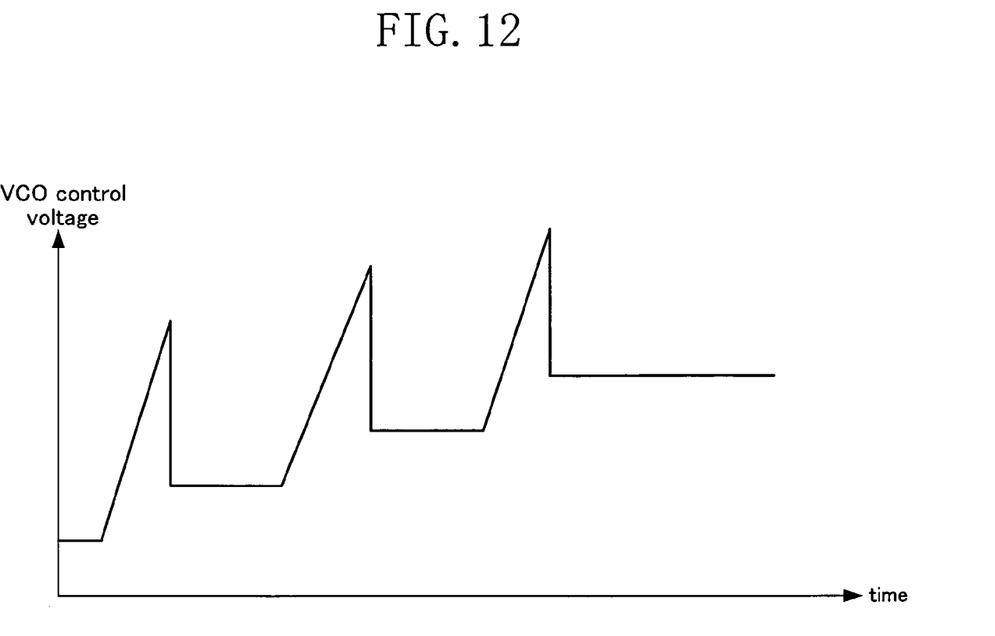
FIG. 12 is a graph illustrating an output voltage of a conventional switched capacitor filter.
Figure 13:
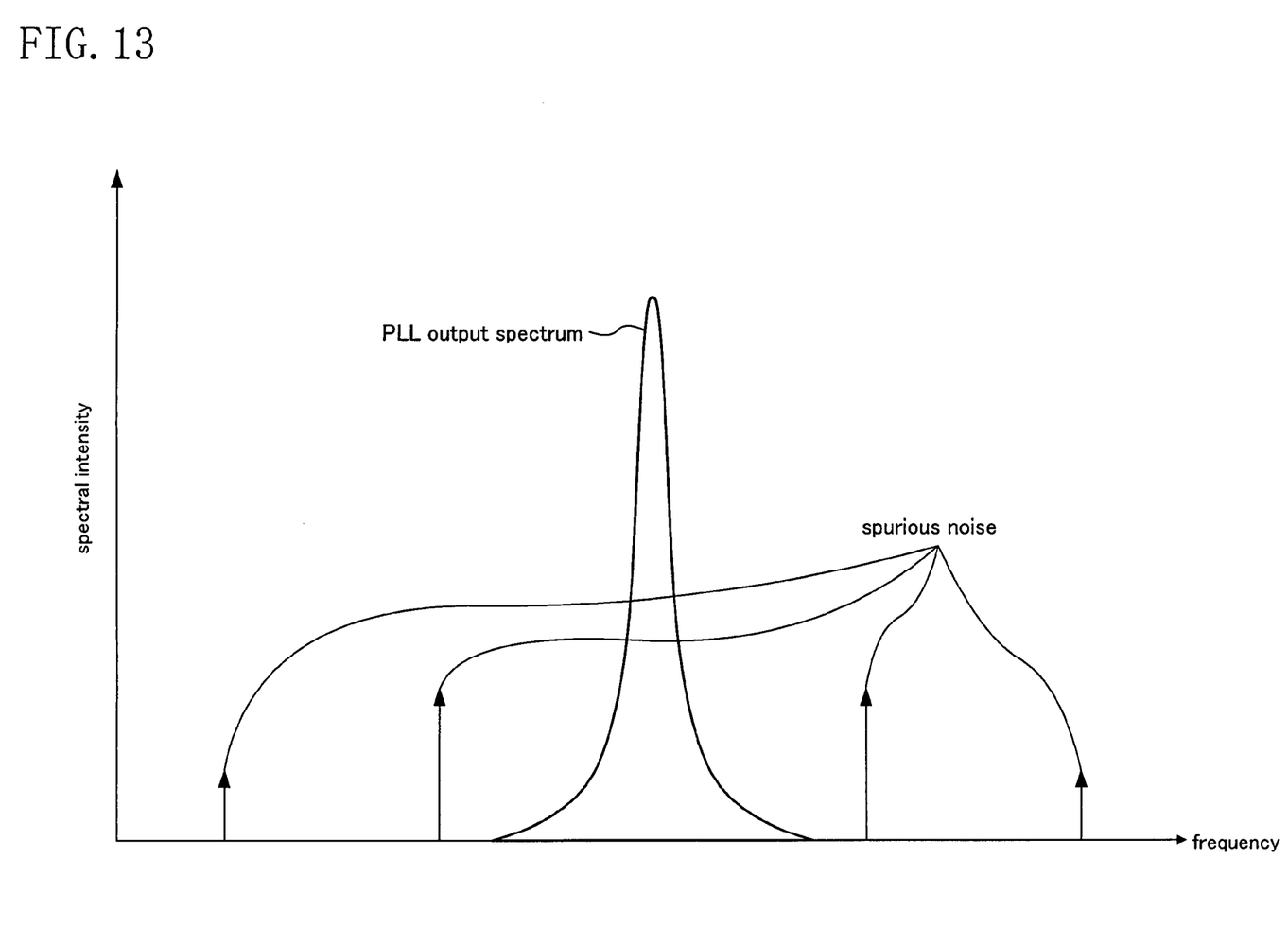
FIG. 13 is a graph illustrating spurious noise contained in an output of a phase locked loop circuit included in a switched capacitor filter.

FIG. 12 is a graph illustrating an output voltage of a conventional switched capacitor filter. This graph illustrates changes in an output voltage when a current signal is intermittently input to the switched capacitor filter. As described above, the output voltage has a triangular shape in the presence of an input current and is constant in the absence of an input current. Therefore, the output voltage of the switched capacitor filter contains a high frequency component. As a result, as illustrated in FIG. 13, the output of the PLL is contaminated with spurious harmonics, resulting in a degradation in signal quality.

SUMMARY OF THE INVENTION

In view of the above-described problems, an object of the present invention is to provide a switched capacitor filter which outputs a substantially smoothed signal, a loop filter which suppresses contamination of spurious harmonics into an output of a feedback system, such as a phase locked loop circuit, a delay lock loop circuit, or the like, and a feedback system comprising such a loop filter.

To achieve the object of the present invention, a switched capacitor filter is provided which comprises a filter capacitance and smoothes an input current signal using the filter capacitance to output a voltage signal, wherein the switched capacitor filter charges electric charge supplied by input of the current signal at a certain phase, outputs a voltage obtained by averaging a voltage generated by the charging and a voltage of the filter capacitance at a previous phase, as the voltage signal, at a next phase, and averages the average voltage and a voltage of the filter capacitance at another next phase.

According to this invention, electric charge supplied by input of a current signal is once charged at a certain phase, a voltage obtained by averaging a voltage generated by the charging and a voltage of the filter capacitance at a previous phase is output at a next phase, and the average voltage and a voltage of the filter capacitance is further averaged at another next phase. Therefore, a charge voltage during sampling is not transferred directly to an output side, and a substantially smoothed voltage signal is output by the filter capacitance.

Specifically, the switched capacitor filter comprises first, second, and third switched capacitor circuits, each of which has a capacitance, and in each of which a first state that the capacitance is connected to an input end of the current signal, a second state that the capacitance is connected to an output end of the voltage signal, and a third state that the capacitance is connected to a side of the filter capacitance, are cycled. The first to third switched capacitor circuits are operated under an interleave control so that the first to third states do not each overlap between the first to third switched capacitor circuits.

Preferably, in the switched capacitor filter, the filter capacitance and the capacitances of the first to third switched capacitor circuits are each a MOS capacitance.

Specifically, the switched capacitor filter comprises a first switched capacitor circuit having two capacitances, wherein when one of the capacitances is connected to an input end of the current signal, the other capacitance is connected to an output end of the voltage signal, and a second switched capacitor circuit having two capacitances, wherein when one of the capacitances is connected to the output end of the voltage signal, the other capacitance is connected to a side of the filter capacitance.

Preferably, the filter capacitance and the capacitances of the first and second switched capacitor circuits are each a MOS capacitance.

The present invention also provides a feedback system of feeding back an output clock generated based on an input clock so that the output clock has a predetermined characteristic, comprising a charge pump circuit of generating a charge current based on a phase difference between the input clock and the fed-back clock, a loop filter having a filter capacitance, of smoothing the charge current input thereto, using the filter capacitance, to output a voltage signal, wherein the switched capacitor filter charges electric charge supplied by input of the charge current at a certain phase, outputs a voltage obtained by averaging a voltage generated by the charging and a voltage of the filter capacitance at a previous phase, as the voltage signal, at a next phase, and averages the average voltage and a voltage of the filter capacitance at another next phase, and an output clock generating circuit of generating the output clock based on the voltage signal output from the loop filter.

According to this invention, in the loop filter, electric charge supplied by input of a charge current is once charged at a certain phase, a voltage obtained by averaging a voltage generated by the charging and a voltage of the filter capacitance at a previous phase is output at a next phase, and the average voltage and a voltage of the filter capacitance is further averaged at another next phase. Therefore, a charge voltage during sampling is not transferred directly to an output side, and a substantially smoothed voltage signal is output by the filter capacitance. As a result, a high frequency component is not contained in a voltage signal output from the loop filter, whereby contamination of spurious harmonics into an output of the feedback system is suppressed.

Specifically, the loop filter further comprises first, second, and third switched capacitor circuits, each of which has a capacitance, and in each of which a first state that the capacitance is connected to an input end of the charge current, a second state that the capacitance is connected to an output end of the voltage signal, and a third state that the capacitance is connected to a side of the filter capacitance, are cycled. The feedback system comprises a control clock generating circuit of generating control clocks having three exclusive phases based on a falling transition of the input clock. The first to third switched capacitor circuits are operated under an interleave control in accordance with the control clocks having the three phases generated by the control clock generating circuit so that the first to third states do not each overlap between the first to third switched capacitor circuits.

Specifically, the loop filter comprises a first switched capacitor circuit having two capacitances, wherein when one of the capacitances is connected to an input end of the charge current, the other capacitance is connected to an output end of the voltage signal, and a second switched capacitor circuit having two capacitances, wherein one of the capacitances is connected to an output end of the voltage signal, the other capacitance is connected to a side of the filter capacitance. The feedback system comprises a control clock generating circuit of generating control clocks having two exclusive phases based on a falling transition of the input clock. The first and second switched capacitor circuits are operated in accordance with the clocks having the two phases generated by the control clock generating circuit.

As described above, according to the present invention, a substantially smoothed voltage signal is output from a switched capacitor filter. In a feedback system comprising this switched capacitor filter as a loop filter, contamination of spurious harmonics into an output thereof is suppressed, thereby making it possible to obtain an output clock having considerably high quality.

DESCRIPTION OF THE PREFERRED EMBODIMENTS

Hereinafter, preferred embodiments of the present invention will be described with reference to the accompanying drawings.

First Embodiment

Figure 1:
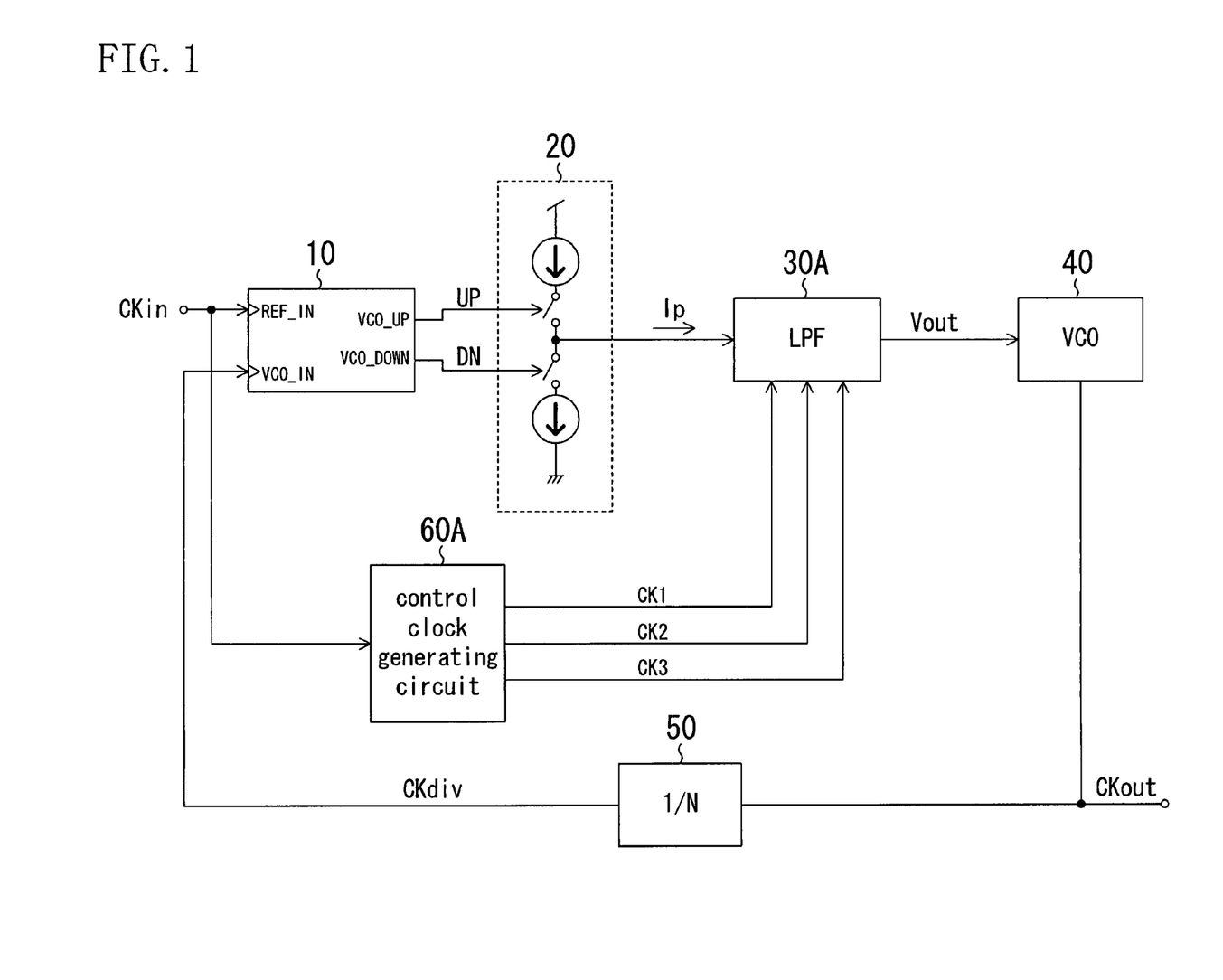
FIG. 1 is a diagram illustrating a structure of a phase locked loop circuit according to a first embodiment.

FIG. 1 illustrates a structure of a PLL according to a first embodiment. The PLL of this embodiment comprises a phase comparator 10, a charge pump circuit 20, a loop filter (LPF) 30A, a voltage control oscillator (VCO) 40 as an output clock generating circuit, a frequency divider 50, and a control clock generating circuit 60A. The phase comparator 10 compares phases of an input clock CKin input to the PLL and a feedback clock CKdiv, and outputs an up signal UP and a down signal DN which correspond to the phase difference. The charge pump circuit 20 performs a push-pull operation based on the up signal UP and the down signal DN to output a charge current Ip (discharge or suction). The voltage control oscillator 40 changes a frequency of an output clock CKout of the PLL based a voltage Vout output from the loop filter 30A. The frequency divider 50 divides the frequency of the output clock CKout by N (N is a natural number) and feeds back a resultant clock as the feedback clock CKdiv to the phase comparator 10. By repetition of the above-described operation, the output clock CKout is gradually converged to a predetermined frequency and is then locked. Hereinafter, structures and operations of the loop filter 30A and the control clock generating circuit 60A will be described in detail.

Figure 2:
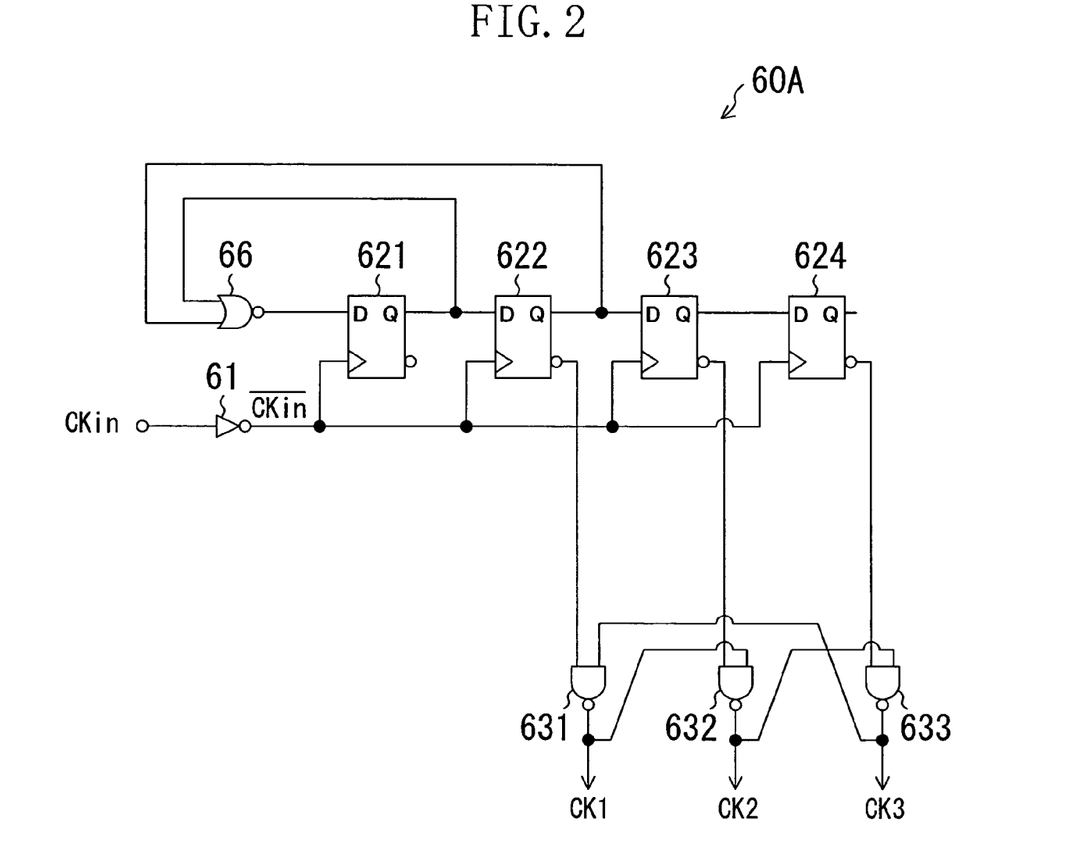
FIG. 2 is a circuit structure diagram of a control clock generating circuit according to the first embodiment.
Figure 3:
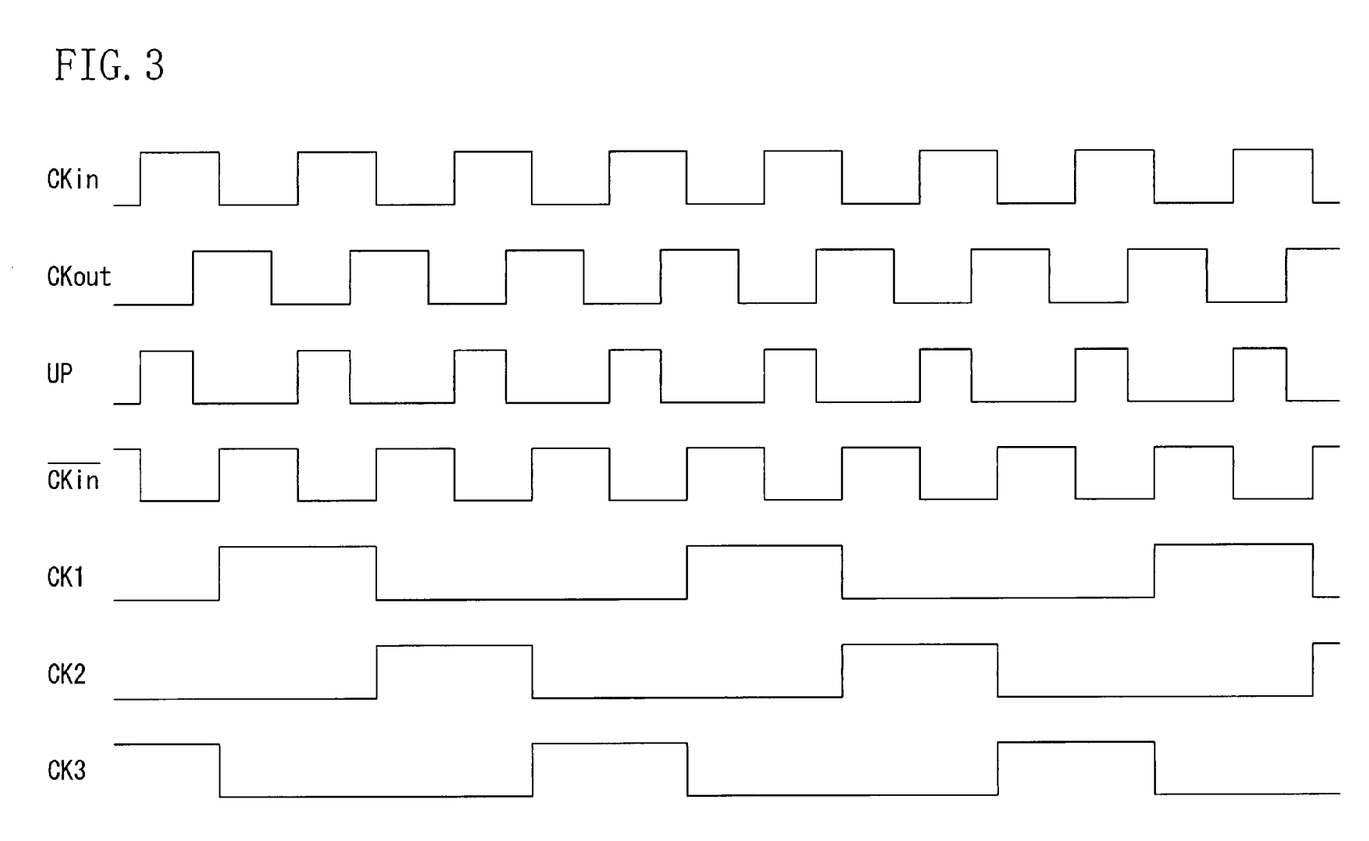
FIG. 3 is a timing chart of the control clock generating circuit of the first embodiment.

The control clock generating circuit 60A generates control clocks CK1, CK2, and CK3 based on a falling transition of the input clock CKin, and outputs these control clocks CK1 to CK3 to the loop filter 30A. FIG. 2 illustrates a circuit structure of the control clock generating circuit 60A. FIG. 3 is a timing chart of the control clock generating circuit 60A.

An inverter 61 inverts the input clock CKin and outputs a clock /CKin. D flip-flops 621, 622, 623, and 624 operate in synchronization with a rising transition of the clock /CKin. Outputs of the D flip-flops 621 and 622 are inputs of a NOR gate 66. An output of the NOR gate 66 is a data input of the D flip-flop 621. A NAND gate 631 outputs a negative logical AND of an inverted output of the D flip-flop 622 and the control clock CK3, as the control clock CK1. A NAND gate 632 outputs a negative logical AND of an inverted output of the D flip-flop 623 and the control clock CK1, as the control clock CK2. A NAND gate 633 outputs a negative logical AND of an inverted output of the D flip-flop 624 and the control clock CK2, as the control clock CK3. The control clocks CK1, CK2, and CK3 output from the control clock generating circuit 60A thus constructed have phases different from each other, and have no on-duty overlap. In other words, the control clock generating circuit 60A generates control clocks having three exclusive phases based on the falling transition of the input clock CKin.

Figure 4:
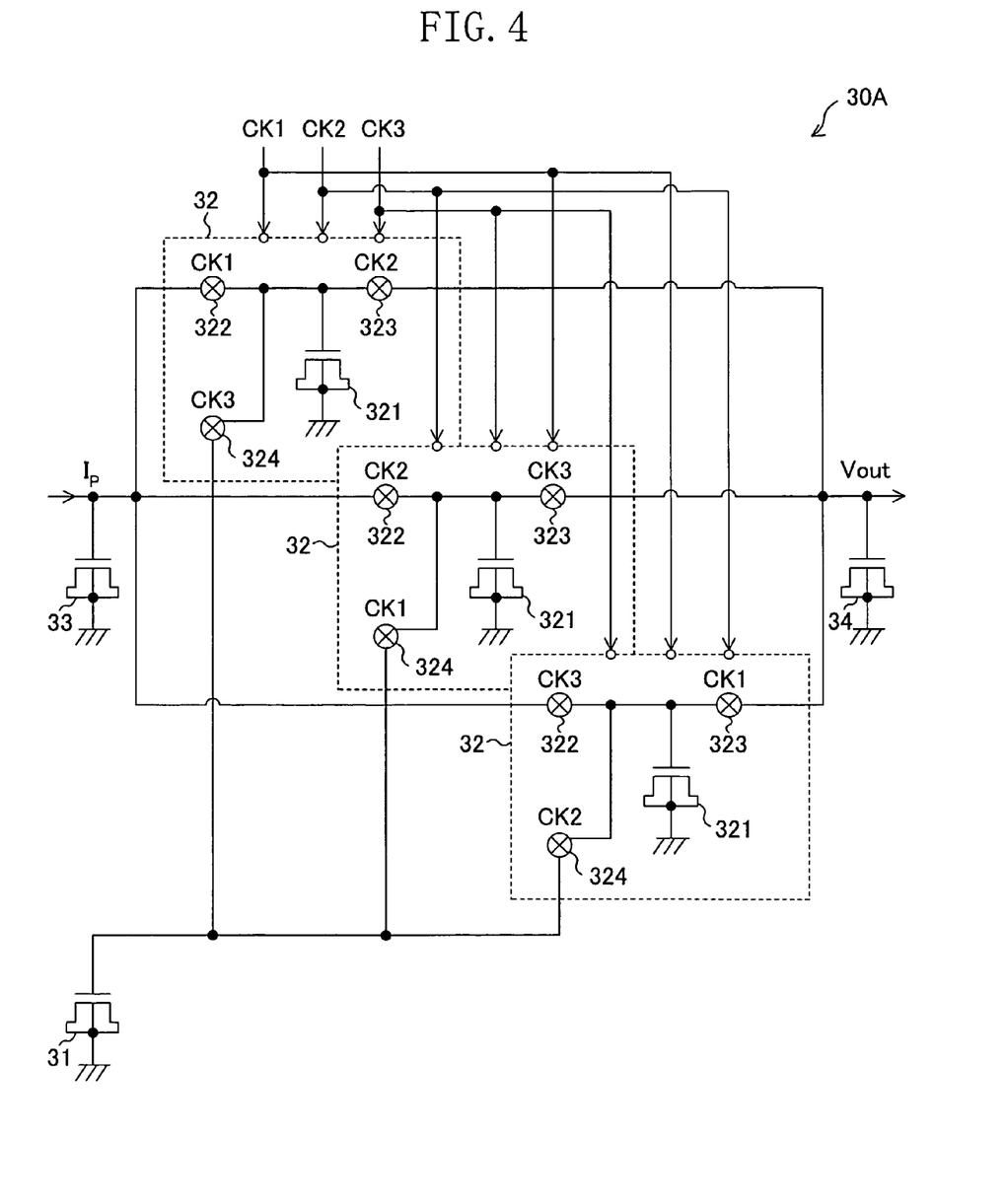
FIG. 4 is a circuit structure diagram of a loop filter according to the first embodiment.

The loop filter 30A is a switched capacitor filter which smoothes the input charge current Ip and outputs the voltage Vout. FIG. 4 illustrates a circuit structure of the loop filter 30A. The loop filter 30A comprises three switched capacitor circuits 32, and capacitances 31, 33, and 34 (MOS capacitances).

Each switched capacitor circuit 32 comprises a capacitance 321 (MOS capacitance), and switches 322, 323, and 324. One end of the capacitance 321 is grounded, and the other end thereof is connected to the switches 322 to 324. Each switch 322 controls the presence or absence of an electrical connection between the corresponding capacitance 321 and an input end of the charge current Ip. Each switch 323 controls the presence or absence of an electrical connection between the corresponding capacitance 321 and an output end of the voltage Vout. Each switch 324 controls the presence or absence of an electrical connection between the corresponding capacitance 321 and the capacitance 31.

One end of the capacitance 31 is grounded, and the other end thereof is connected to the switch 324 of each switched capacitor circuit 32. The capacitance 31 successively receives electric charge from the capacitance 321 of a switched capacitor circuit 32 whose switch 324 is ON. In other words, the capacitance 31 functions as a filter capacitance which accumulates electric charge supplied by the charge current Ip to generate a smooth voltage.

One end of the capacitance 33 is grounded and the other end thereof is connected to the input end of the charge current Ip. One end of the capacitance 34 is grounded, and the other end thereof is connected to the output end of the voltage Vout. The capacitances 33 and 34 mainly have a function of relaxing switching noise of each switched capacitor circuit 32. The capacitances 33 and 34 can be theoretically omitted, but are preferably provided in actual circuits.

Figure 5A:
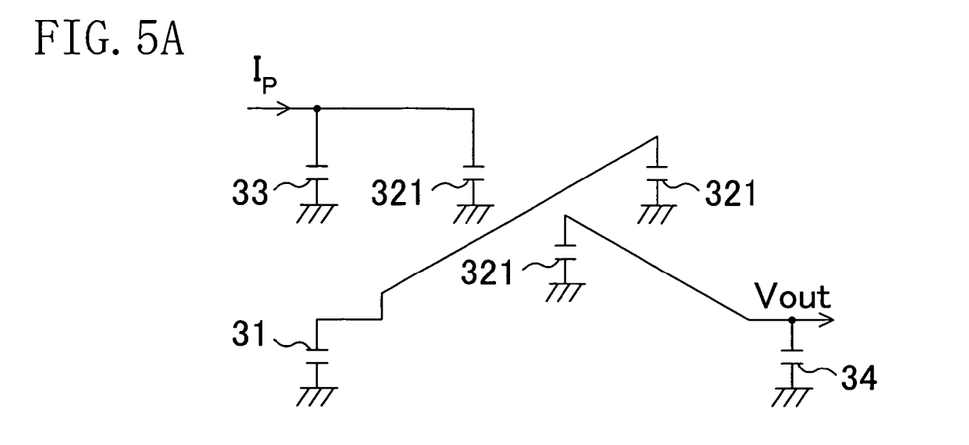
FIGS. 5A, 5B, and 5C are diagrams illustrating a change in a connected state of a capacitance in a switched capacitor circuit according to the first embodiment.
Figure 5B:
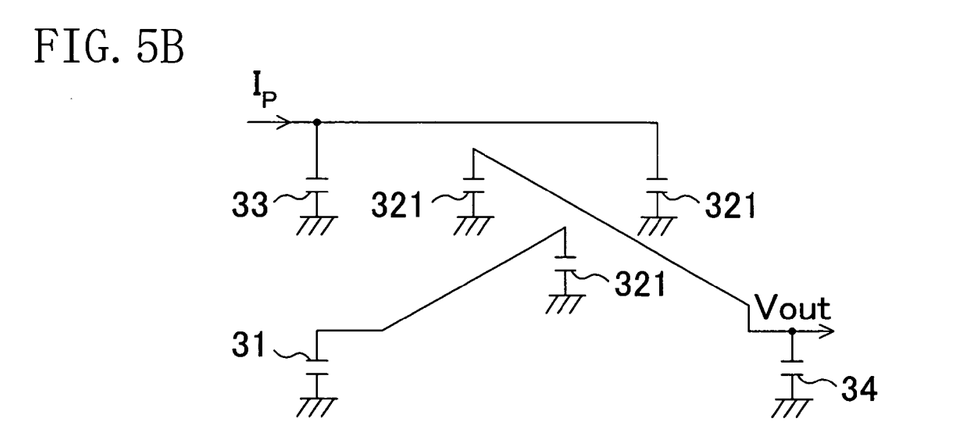
Figure 5C:
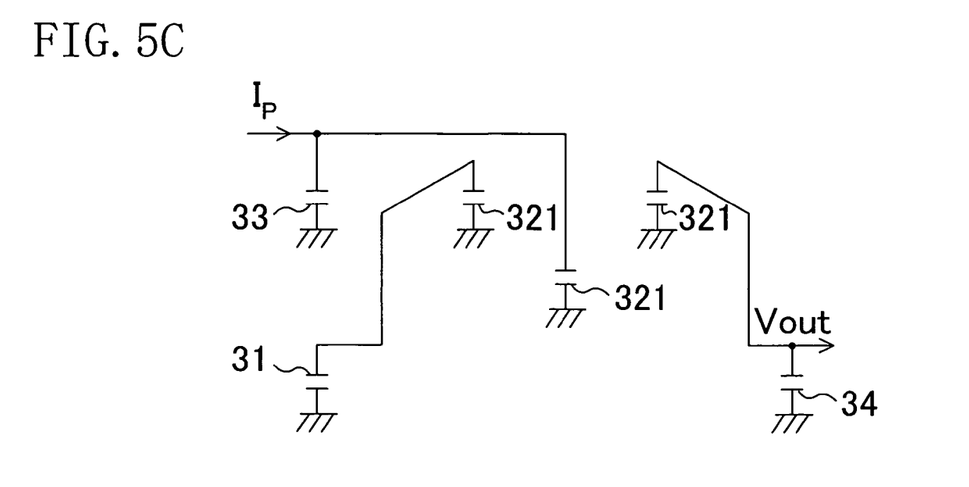

The switches 322 to 324 of each switched capacitor circuit 32 are operated in accordance with the control clocks CK1, CK2, and CK3 so that a state in which only the switch 322 is ON, a state in which only the switch 323 is ON, and a state in which only the switch 324 is ON, are cycled. The three switched capacitor circuits 32 are operated under an interleave control so that the operated states thereof do not each overlap between the three switched capacitor circuits 32. FIGS. 5A, 5B, and 5C illustrate variations of a connected state of the capacitance 321 in each switched capacitor circuit 32. The connected state of the capacitance 321 in each switched capacitor circuit 32 is changed in order of FIGS. 5A, 5B, and 5C, and after the connected state of FIG. 5C, the transition of the connected states is started again from the connected state of FIG. 5A.

Each switched capacitor circuit 32 is operated under a switching control in accordance with the control clocks CK1 to CK3, and therefore, timing of the switching is when the input clock CKin makes a falling transition. Therefore, the switching control of each switched capacitor circuit 32 is not performed during a time when the charge current Ip is being input, thereby guaranteeing a normal operation of the loop filter 30A.

An operation of the loop filter 30A of this embodiment will be described below, where attention is paid to one capacitance 321. Specifically, at a certain phase, the capacitance 321 is connected to the input end of the charge current Ip so as to be charged with electric charge supplied by input of the charge current Ip (sampling operation). Here, the capacitance 321 has been connected to the capacitance 31 at the previous phase, and holds a voltage averaged between the capacitance 321 and the capacitance 31 at the previous phase. Therefore, when the capacitance 321 is connected to the input end of the charge current Ip, a voltage generated by the input of the charge current Ip and the voltage averaged between the capacitance 321 and the capacitance 31 at the previous phase, are further averaged, so that the capacitance 321 holds the resultant average voltage. At the next phase, the capacitance 321 is connected to the output end of the voltage Vout so that the above-described average voltage is transferred to the output end (voltage output operation). At another next phase, the capacitance 321 is connected to the capacitance 31, thereby the charged electric charge is transferred to the capacitance 31, so that the voltages of the capacitance 321 and the capacitance 31 are further averaged (equalization operation). By repeating the set of the sampling operation, the output operation, and the equalization operation so that each operation does not overlap between the three capacitances 321, in a staggered manner, the voltages of the capacitance 31, 33, and 34, and the three capacitances 321 are converged to a single average voltage.

Figure 6:
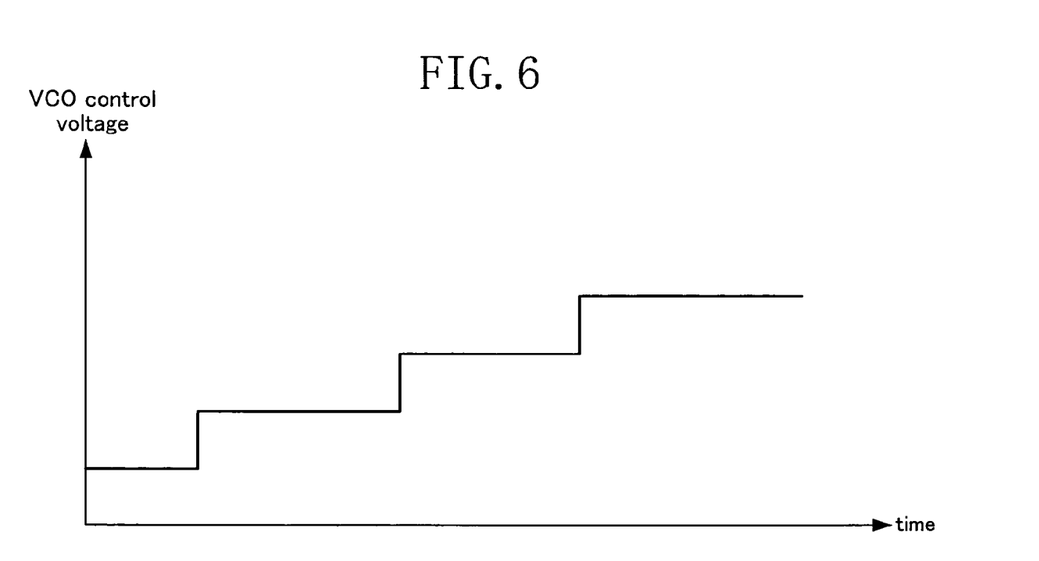
FIG. 6 is a graph illustrating an output voltage of the switched capacitor filter of the first embodiment.

As described above, according to this embodiment, in a loop filter which is constructed as a switched capacitor filter, a voltage signal is output at the next phase after an input charge current is once sampled. In other words, a substantially smoothed voltage signal is output from the loop filter. FIG. 6 is a graph illustrating an output voltage of the loop filter of this embodiment. A triangular wave does not appear in the output of the loop filter of this embodiment, and a substantially smoothed voltage is output in a stepwise manner. Thereby, contamination of spurious harmonics into the output of the PLL of this embodiment is suppressed, whereby a high-quality output clock is generated.

Although three switched capacitor circuits are operated under an interleave control in the foregoing description, an effect similar to that which has been described above can be obtained when n (n is an integer of 4 or more) switched capacitor circuits are operated under an interleave control. Specifically, by an interleave control of n switched capacitor circuits in which n switches are connected to one capacitance using control clocks having n exclusive phases, a voltage can be output at the next phase after an input current is once sampled.

The switches 322 to 324 may be switched ON when the control clocks CK1 to CK3 are at the Lo level. In this case, the control clock generating circuit 60A only needs to generate control signals CK1 to CK3 having logics inverse to those described above.

Second Embodiment

Figure 7:
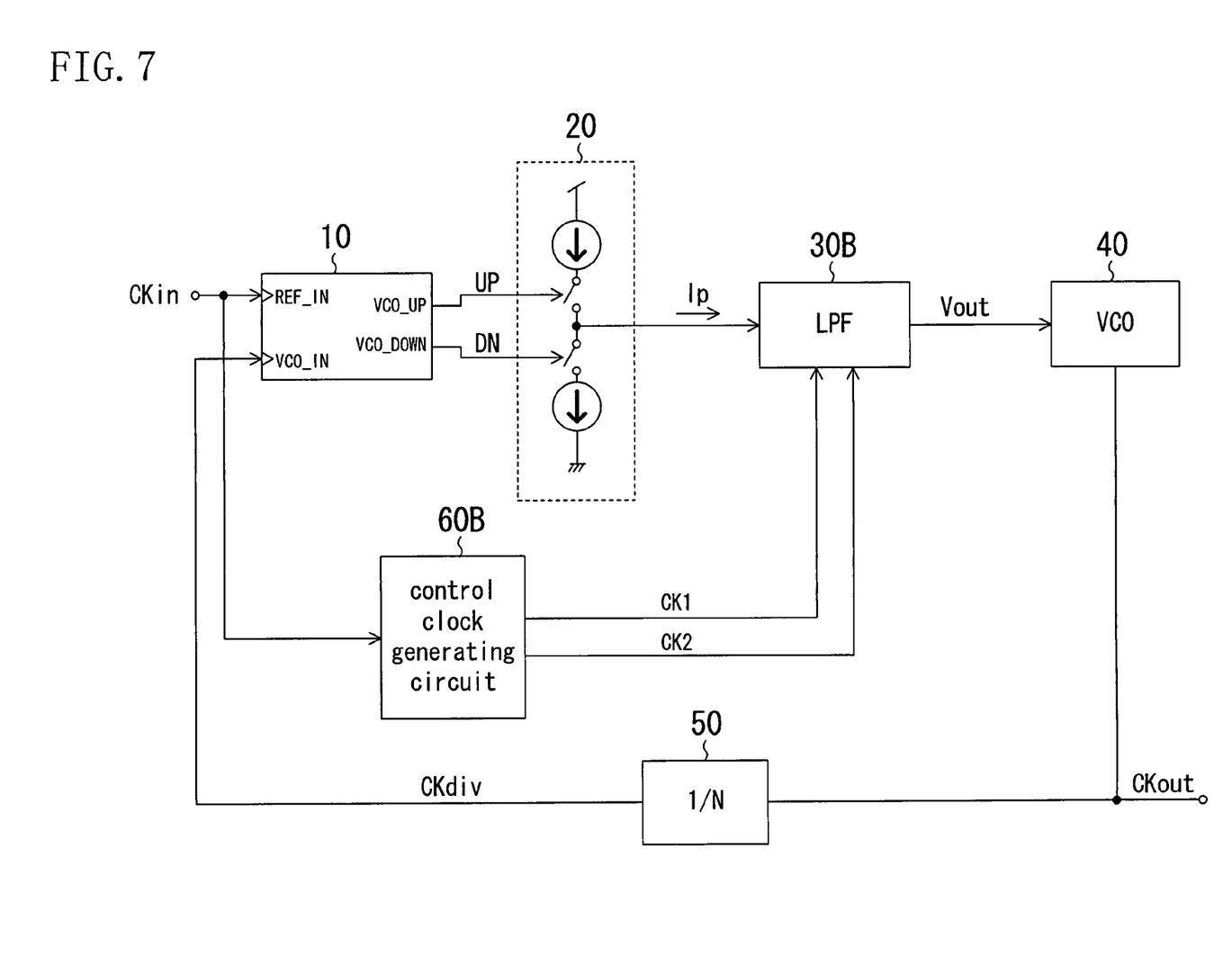
FIG. 7 is a diagram illustrating a structure of a phase locked loop circuit according to a second embodiment.

FIG. 7 illustrates a structure of a PLL according to a second embodiment. The PLL of this embodiment comprises a loop filter 30B and a control clock generating circuit 60B which have structures different from those of the PLL of the first embodiment. The other components are similar to those of the first embodiment. Hereinafter, only a difference from the first embodiment will be described.

Figure 8:
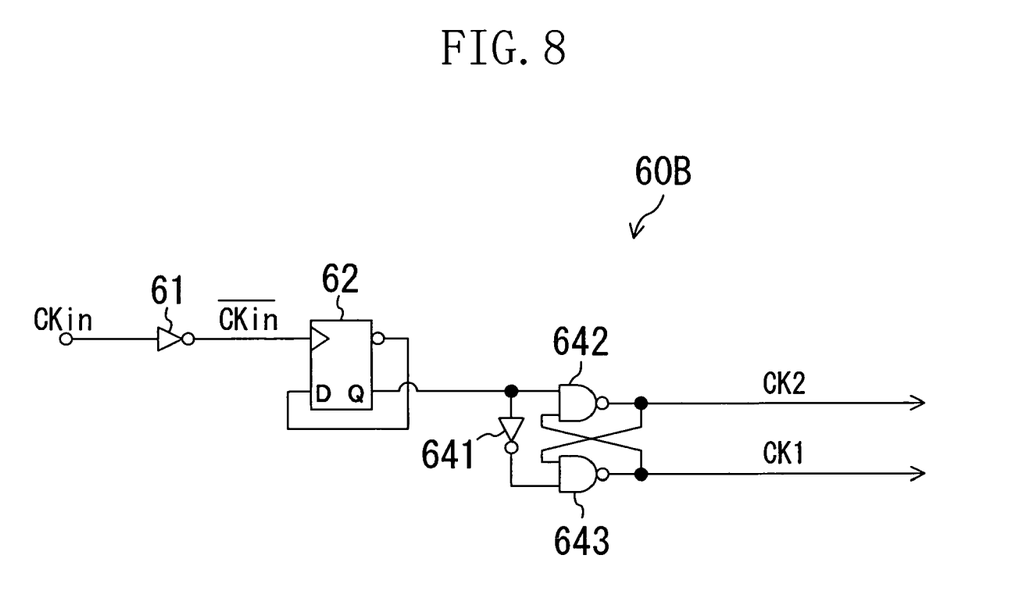
FIG. 8 is a circuit structure diagram of a control clock generating circuit according to the second embodiment.
Figure 9:
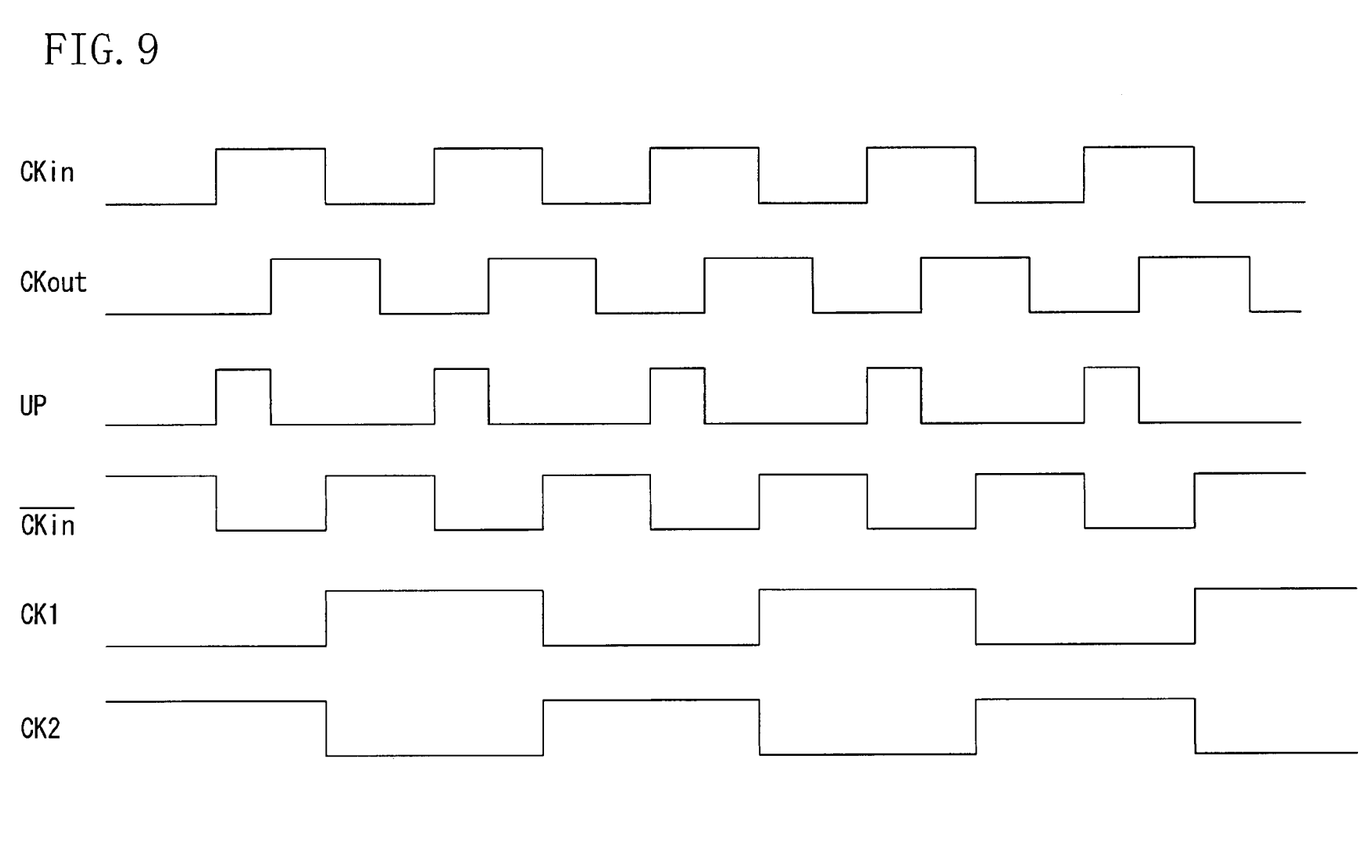
FIG. 9 is a timing chart of the control clock generating circuit of the second embodiment.

The control clock generating circuit 60B generates control clocks CK1 and CK2 based on a falling transition of an input clock CKin, and outputs these control clocks to the loop filter 30B. FIG. 8 illustrates a circuit structure of the control clock generating circuit 60B. FIG. 9 is a timing chart of the control clock generating circuit 60B.

An inverter 61 inverts the input clock CKin to output a clock /CKin. A D flip-flop 62 operates in synchronization with a rising transition of the clock /CKin. A circuit portion composed of an inverter 641 and NAND gates 642 and 643 generates the control clocks CK1 and CK2 based on a Q output of the D flip-flop 62. The control clocks CK1 and CK2 output from the control clock generating circuit 60B thus constructed have phases different from each other, and have no on-duty overlap. In other words, the control clock generating circuit 60B generates control clocks having two exclusive phases based on a falling transition of the input clock CKin.

Figure 10:
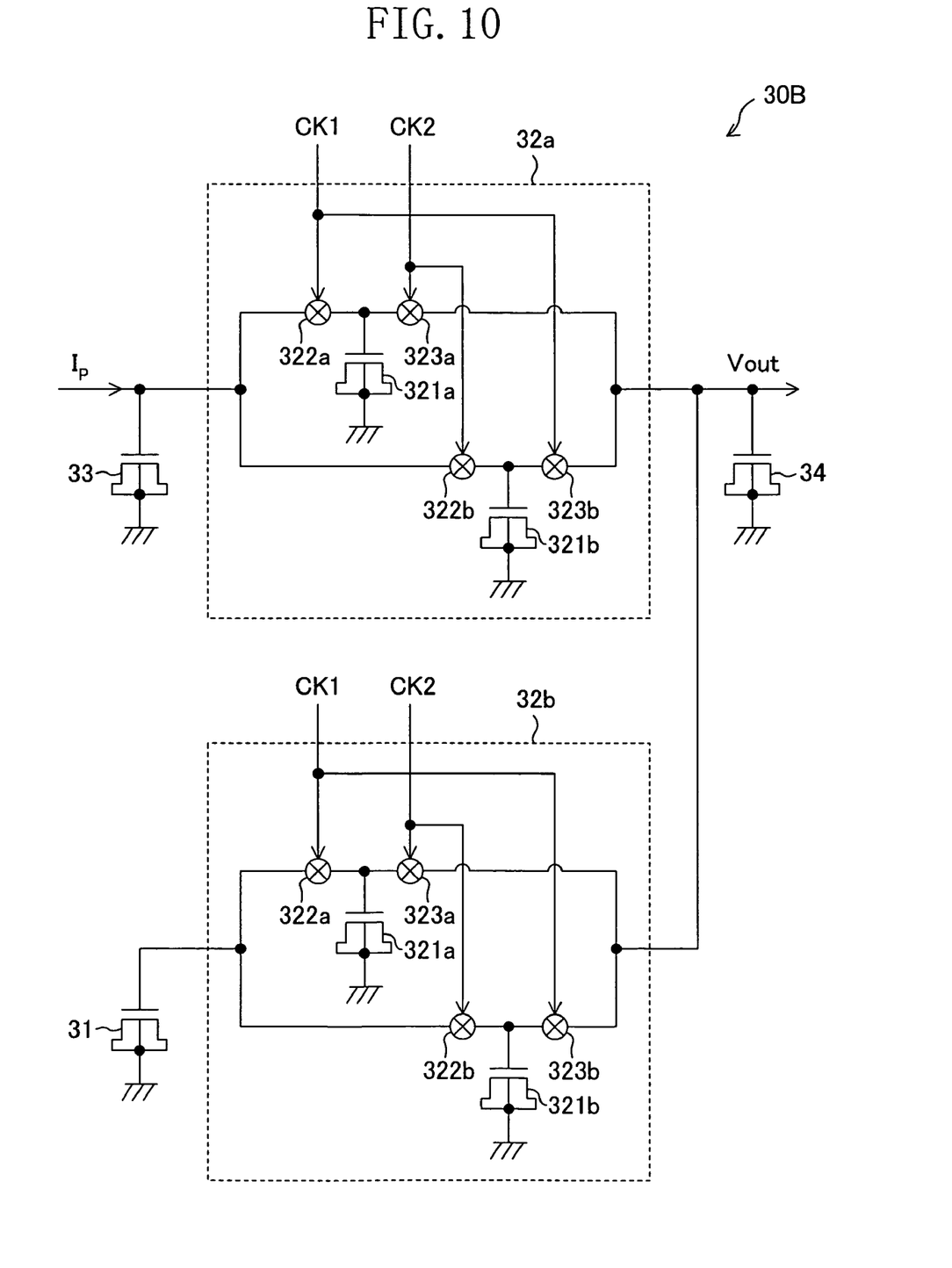
FIG. 10 is a circuit structure diagram of a loop filter according to the second embodiment.

The loop filter 30B is a switched capacitor filter which smoothes an input charge current Ip to output a voltage Vout. FIG. 10 illustrates a circuit structure of the loop filter 30B. The loop filter 30B comprises switched capacitor circuits 32a and 32b, and capacitances 31, 33, and 34 (MOS capacitances).

The switched capacitor circuit 32a comprises capacitances 321a and 321b (MOS capacitances), and switches 322a, 322b, 323a, and 323b. One end of the capacitance 321a is grounded, and the other end thereof is connected to the switches 322a and 323a. Similarly, one end of the capacitance 321b is grounded, and the other end thereof is connected to the switches 322b and 323b. The switch 322a controls the presence or absence of an electrical connection between the capacitance 321a and an input end of the charge current Ip. The switch 323a controls the presence or absence of an electrical connection between the capacitance 321a and an output end of the voltage Vout. Similarly, the switch 322b controls the presence or absence of an electrical connection between the capacitance 321b and the input end of the charge current Ip. The switch 323b controls the presence or absence of an electrical connection between the capacitance 321b and the output end of the voltage Vout.

One end of the capacitance 31 is grounded, and the other end thereof is connected to the switch 322a and 322b of the switched capacitor circuit 32b. Note that the switched capacitor circuit 32b has a structure similar to that of the switched capacitor circuit 32a, except that the switches 322a and 322b are connected to the capacitance 31. When the switch 322a of the switched capacitor circuit 32b is ON, the capacitance 31 receives electric charge from the capacitance 321a of the switched capacitor circuit 32b. When the switch 322b of the switched capacitor circuit 32b is ON, the capacitance 31 receives electric charge from the capacitance 321b of the switched capacitor circuit 32b. In other words, the capacitance 31 functions as a filter capacitance which accumulates electric charge supplied by input of the charge current Ip to generate a smooth voltage. The capacitances 33 and 34 are as described in the first embodiment.

Figure 11A:
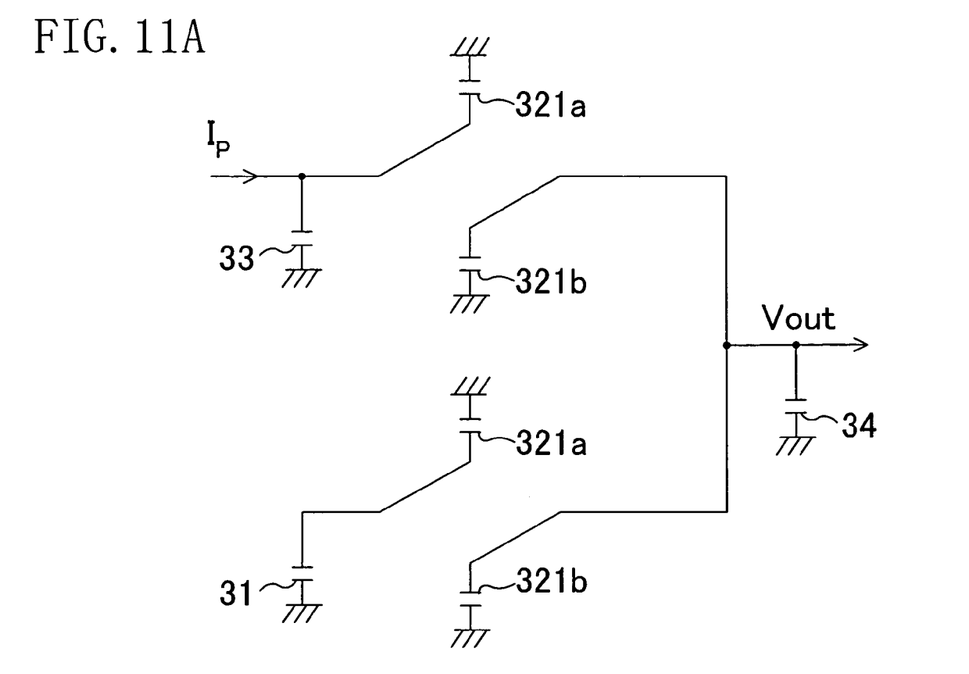
FIGS. 11A and 11B are diagrams illustrating a change in a connected state of a capacitance in a switched capacitor circuit according to the second embodiment.
Figure 11B:
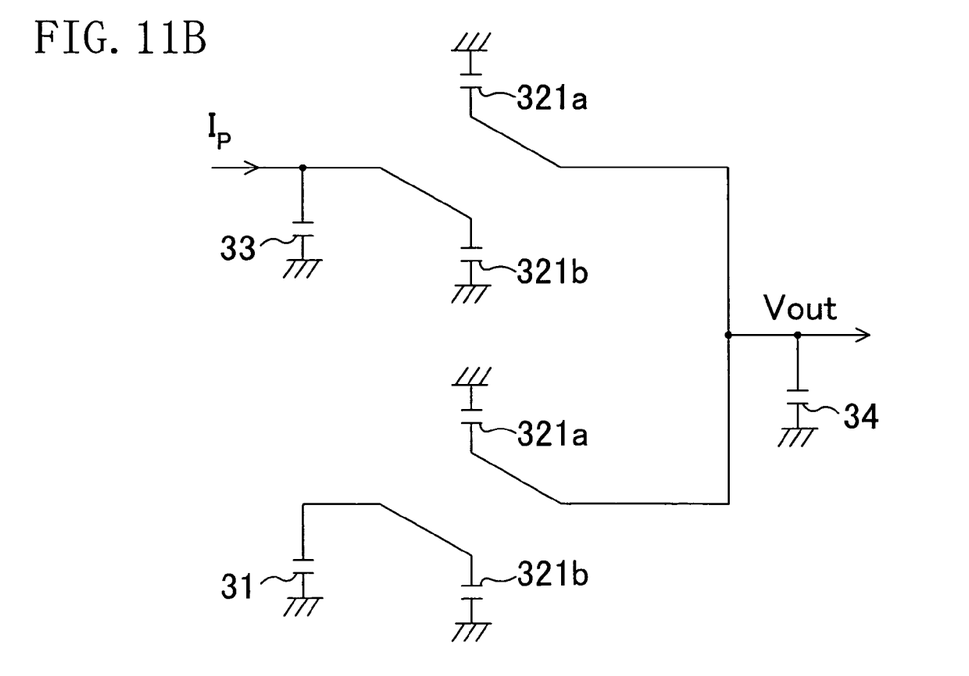

In the switched capacitor circuit 32a, the switches 322a and 323b are operated in accordance with the control clock CK1, and the switches 322b and 323a are operated in accordance with the control clock CK2. Therefore, when one of the capacitance 321a and 321b is connected to the input end of the charge current Ip, the other is connected to the output end of the voltage Vout. Similarly, in the switched capacitor circuit 32b, the switches 322a and 323b are operated in accordance with the control clock CK1, and the switches 322b and 323a are operated in accordance with the control clock CK2. Therefore, when one of the capacitance 321a and 321b is connected to the capacitance 31, the other is connected to the output end of the voltage Vout. FIGS. 11A and 11B illustrate changes in connected states of the capacitances 321a and 321b of the switched capacitor circuits 32a and 32b. In the capacitances 321a and 321b of the switched capacitor circuits 32a and 32b, the connected states of FIGS. 11A and 11B are alternately repeated.

An operation of the loop filter 30B of this embodiment will be described below, where attention is paid to the capacitance 321a. Specifically, at a certain phase, the capacitance 321a of the switched capacitor circuit 32a is connected to the input end of the charge current Ip so as to be charged with electric charge supplied by input of the charge current Ip (sampling operation). In this case, the capacitance 321a of the switched capacitor circuit 32b is connected to the capacitance 31, and therefore, holds a voltage averaged between the capacitance 321a and the capacitance 31. At the next phase, both the capacitances 321a of the switched capacitor circuits 32a and 32b are connected to the output end of the voltage Vout, so that voltages of the capacitances 321a are averaged, and the average voltage is output (voltage output operation). At another next phase, when the capacitance 321a of the switched capacitor circuit 32b is connected to the capacitance 31, electric charge accumulated in the capacitance 321a is transferred to the capacitance 31, so that voltages of the capacitance 321a and the capacitance 31 are further averaged (equalization operation). By repeating the set of the sampling operation, the output operation, and the equalization operation so that each operation does not overlap between the combination of the two capacitances 321a and the combination of the two capacitances 321b, the voltages of the capacitance 31, 33, and 34, and the two capacitances 321a and 321b are converged to a single average voltage.

As described above, according to this embodiment, a substantially smoothed loop filter output can be obtained by an interleave control of two switched capacitor circuits. The output voltage of the loop filter of this embodiment is changed in a manner similar to that which is illustrated in the graph of FIG. 6. In this embodiment, advantageously, the capacitance values of the capacitances 321a and 321b of the switched capacitor circuits 32a and 32b can be independently set, and the control clock generating circuit 60B has a relatively simple structure.

Note that, in the first and second embodiments, the capacitances included in the loop filters 30A and 30B may be each, for example, a double-layer polysilicon capacitance, an interconnect capacitance, a MIM capacitance, or the like as well as a MOS capacitance. However, since an MOS capacitance has the largest capacitance per unit area among capacitances included in an LSI, it is preferable to use the MOS capacitance in terms of a reduction in circuit scale. In order to use a MOS transistor as a MOS capacitance, a voltage higher than or equal to a threshold voltage thereof needs to be applied thereto. In the loop filter according to the present invention, a voltage higher than or equal to a threshold voltage of an MOS transistor is consistently applied thereto, so that a condition for use of an MOS capacitance is satisfied.

In addition, in each of the PLLs of the FIGS. 1 and 7, if a voltage control delay circuit (VCD) as an output clock generating circuit is provided instead of the voltage control oscillator 40, and the frequency divider 50 is omitted so that the output clock CKout output by the voltage control delay circuit is fed back directly to the phase comparator 10, a delay lock loop circuit (DLL) is constructed.

What is claimed is:

1. A switched capacitor filter which comprises a filter capacitance and smoothes an input current signal using the filter capacitance to output a voltage signal, comprising:
    switched capacitor circuits which exist between an input end of the current signal and an output end of the voltage signal and which exist between the output end of the voltage signal and one end of the filter capacitance,
    the switched capacitor circuits include at least three switched capacitor circuits, each of which has a capacitance, one end of the capacitance being connected to the input end of the current signal, the output end of the voltage signal and the one end of the filter capacitance via respective switches,
    in each of the switched capacitor circuits, a first state that the one end of the capacitance is electrically connected to the input end of the current signal, a second state that the one end of the capacitance is electrically connected to the output end of the voltage signal, and a third state that the one end of the capacitance is electrically connected to the one end of the filter capacitance, are cycled, and
    the switched capacitor circuits are operated under an interleave control so that any three of them are exclusively in the first to third states.

2. The switched capacitor filter of claim 1, wherein the filter capacitance and the capacitances of the switched capacitor circuits are each a MOS capacitance.

3. A feedback system of feeding back an output clock generated based on an input clock so that the output clock has a predetermined characteristic, comprising:
    a charge pump circuit of generating a charge current based on a phase difference between the input clock and the fed-back clock;
    a loop filter having a filter capacitance, of smoothing the charge current input thereto, using the filter capacitance, to output a voltage signal, the loop filter comprising switched capacitor circuits which exist between an input end of the charge current and an output end of the voltage signal and which exist between the output end of the voltage signal and one end of the filter capacitance;
    an output clock generating circuit of generating the output clock based on the voltage signal output from the loop filter, wherein
    the switched capacitor circuits include at least three switched capacitor circuits, each of which has a capacitance, one end of the capacitance being connected to the input end of the charge current, the output end of the voltage signal and the one end of the filter capacitance via respective switches, and
    in each of the switched capacitor circuits, a first state that the one end of the capacitance is electrically connected to the input end of the charge current, a second state that the one end of the capacitance is electrically connected to the output end of the voltage signal, and a third state that the one end of the capacitance is electrically connected to the one end of the filter capacitance, are cycled, and
    the feedback system comprises:
        a control clock generating circuit of generating control clocks having three exclusive phases based on a falling transition of the input clock,
    wherein the switched capacitor circuits are operated under an interleave control in accordance with the control clocks having the three phases generated by the control clock generating circuit so that any three of them are exclusively in the first to third states.

* * * * *